United States Patent
Scheer et al.

(10) Patent No.: US 7,807,494 B2
(45) Date of Patent: Oct. 5, 2010

(54) METHOD FOR PRODUCING A CHALCOGENIDE-SEMICONDUCTOR LAYER OF THE $ABC_2$ TYPE WITH OPTICAL PROCESS MONITORING

(75) Inventors: Roland Scheer, Berlin (DE); Christian Pietzker, Blankenfelde (DE)

(73) Assignee: Hahn-Meitner-Institut Berlin GmbH, Berlin (DE)

( * ) Notice: Subject to any disclaimer, the term of this patent is extended or adjusted under 35 U.S.C. 154(b) by 0 days.

(21) Appl. No.: 10/474,472

(22) PCT Filed: Apr. 4, 2002

(86) PCT No.: PCT/DE02/01342

§ 371 (c)(1),
(2), (4) Date: Oct. 8, 2003

(87) PCT Pub. No.: WO02/084729

PCT Pub. Date: Oct. 24, 2002

(65) Prior Publication Data

US 2004/0115938 A1   Jun. 17, 2004

(30) Foreign Application Priority Data

Apr. 12, 2001   (DE) .............................. 101 19 463

(51) Int. Cl.
*H01L 21/00* (2006.01)
*H01L 21/66* (2006.01)
(52) U.S. Cl. .................. 438/95; 438/102; 438/479
(58) Field of Classification Search .............. 438/57, 438/95, 102, 479, 7, 16; 117/201, 10; 427/10, 427/581–584, 553–556, 241–255, 255.31
See application file for complete search history.

(56) References Cited

U.S. PATENT DOCUMENTS

| | | | | |
|---|---|---|---|---|
| 4,526,468 A | * | 7/1985 | Steigmeier et al. | 356/338 |
| 5,445,847 A | * | 8/1995 | Wada et al. | 427/74 |
| 5,578,503 A | * | 11/1996 | Karg et al. | 438/95 |
| 5,725,671 A | * | 3/1998 | Nishitani et al. | 118/665 |
| 5,985,691 A | * | 11/1999 | Basol et al. | 438/95 |
| 6,127,202 A | * | 10/2000 | Kapur et al. | 438/47 |

(Continued)

OTHER PUBLICATIONS

Negami et al Real time composition monitoring methods in PVD of (cu(in,Ga)se thin films, Thin Film for Photovoltaic and Realted Device Applications< Symposium< San Francisco, CA,USA, Apr. 8-11, 1996, 1996, Pittsburg,PA,USA,Mater,Res.Soc,USA,pp. 267-278.*

Klaer et al.: A Tolerant Two Step Process for Efficient CuInS2 Solar Cells; 2nd World Conference and Exhibition on Photovoltaic Solar Energy Conversion, Jul. 6-10, 1993, Vienna, Austria.

(Continued)

*Primary Examiner*—Savitri Mulpuri
(74) *Attorney, Agent, or Firm*—Darby & Darby

(57) ABSTRACT

A method of monitoring the chalcogenation process in which the chalcogenide semiconductor layer is produced by initially sequentially depositing the two precursor layers of elements A and B and thereafter carrying out a chalcogenizing process with a simultaneous optical process control in which the layer sequence A B is irradiated by light from at least one coherent light source, the light diffusely scattered at the surface is detected and the scattered light signal measured as a function of time is evaluated such that characteristic changes in the layer developing during the chalcogenation are assigned to four characteristic points of the scattered light signal curve.

4 Claims, 2 Drawing Sheets

U.S. PATENT DOCUMENTS

Figure 1:
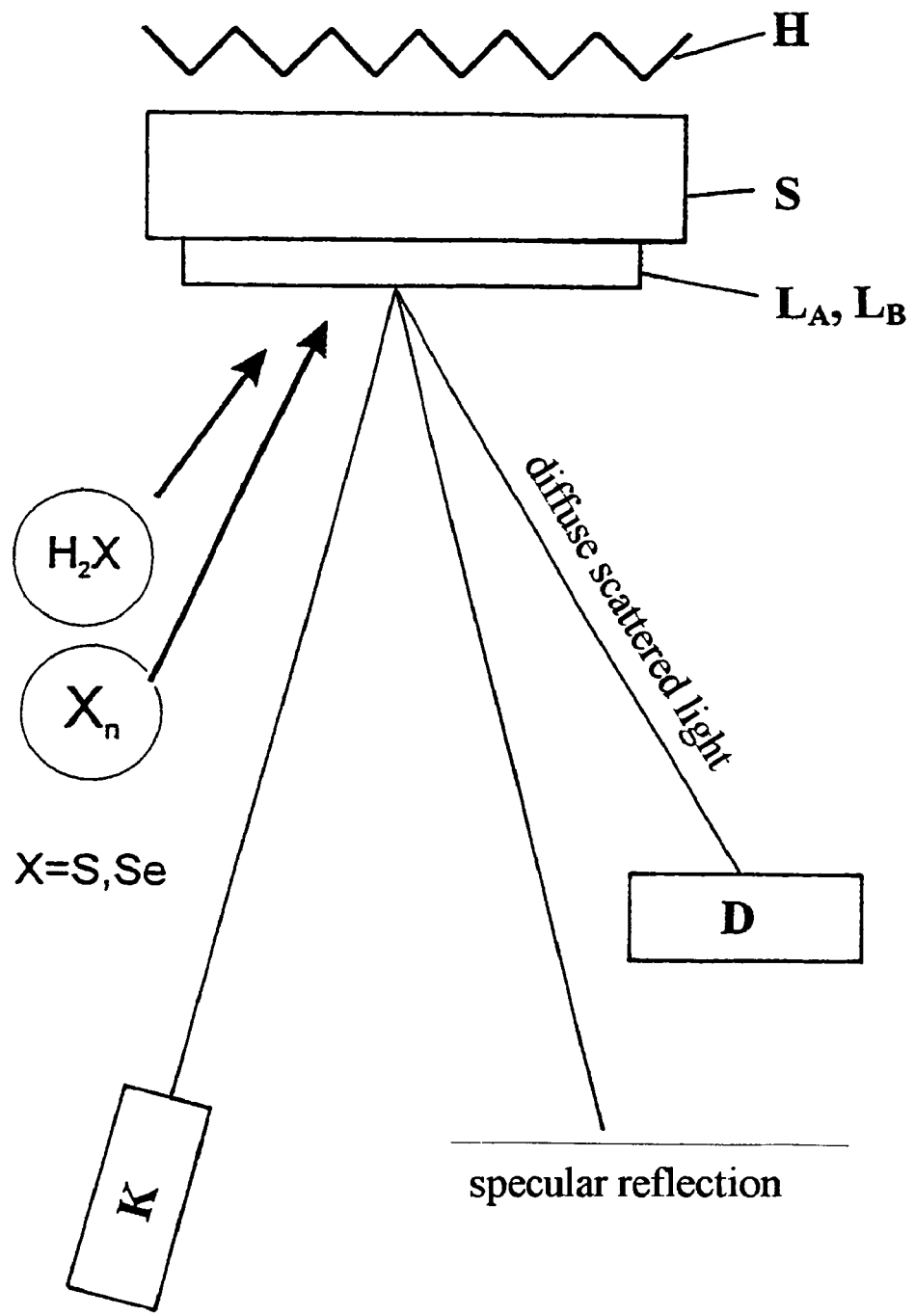

| | | | |
|---|---|---|---|
| 6,228,672 B1 * | 5/2001 | Ashby | 438/38 |
| 6,709,958 B2 * | 3/2004 | Li et al. | 438/513 |
| 6,716,283 B2 * | 4/2004 | Yamaguchi et al. | 117/7 |
| 2002/0006470 A1 * | 1/2002 | Eberspacher et al. | 427/216 |

OTHER PUBLICATIONS

Rouleau et al.: In situ, real-time diffuse optical reflectivity measurements during GaAs cleaning and subsequent ZnSe/GaAs heteroepitaxy; J. Vac. Sci. Technol. A 11(4), Jul./Aug. 1993; pp. 1792-1795.

* cited by examiner

METHOD FOR PRODUCING A CHALCOGENIDE-SEMICONDUCTOR LAYER OF THE $ABC_2$ TYPE WITH OPTICAL PROCESS MONITORING

BACKGROUND OF THE INVENTION

1. Field of the Invention

The invention relates to a method of producing a chalcogenide semiconductor layer of the $ABC_2$ type with optical process monitoring, wherein the developing layer is irradiated with light during its production, the light reflected from the layer is detected and the received light signal is assigned to characteristic points of the layer production.

2. The Prior Art

U.S. Pat. No. 5,725,671 discloses an apparatus for producing a thin layer of $ABC_2$ chalcopyrite which, in addition to a substrate support and means for providing the elements A (Cu or Ag), B (In, Ga or Al) and C (S, Se or Te) also provides means for monitoring/presenting the physical properties of the developing layer over time. During production of the chalcopyrite thin layer of the $ABC_2$ type, the materials A, B and C, in a first step, are deposited simultaneously deposited on a substrate and, in a second step, either a gas with elements B and C or a gas with elements A, B and C, with B being present in excess, reacts with the thin layer applied during the first step. At the same time, an optical process control is performed in order to define the terminal point of the second step about a specific change of the physical properties of the developing layer. For this purpose, the developing chalcogenide layer (among others) is irradiated with IR light and the light reflected from the surface of this layer is measured in dependency of time. The terminal point of the production process results from the interval of 5 to 15 minutes' time following the last abrupt change of the signal. However, no provision has been made directly to deduce the terminal point of the production process from a signature of the measured light.

The production of polycrystalline chalcogenide semiconductor layers by means of a chalcogenation of individual/successively deposited metallic precursor layers is generally known from the prior art (described, for instance, in Thin Film Cells and Technologies; $2^{nd}$ World Conference and Exhibition on Photovoltaic Solar Energy Conversion, 6-10 Jul. 1993, Vienna, Austria, pp. 537-540). The sulfurizing/chalcogenizing process takes place in a lamp furnace or in a thermally heated furnace and may take only a very short time. Technologically conditioned variations of the properties of the precursor layers and of the process parameters may lead to deviations in the process sequence and in most cases necessitate a change in its sequence. Hitherto, it has not been possible to control the last-mentioned process in dependence of the physical properties of the developing chalcogenide layer.

OBJECT OF THE INVENTION

It is thus an object of the invention to propose a method of controlling the chalcogenizing process and, therefore, regulation of the process, and of defining its terminal point independently of a time frame.

SUMMARY OF THE INVENTION

In accordance with the invention the object of a process of the kind referred to above is accomplished by producing the chalcogenide semiconductor layer by initially sequentially depositing the two metallic precursor layer of elements A and B and by thereafter carrying out a chalcogenizing process under a simultaneous optical process control during which the layer sequence A B is irradiated with light from at least one coherent light source which makes possible and diffusely scattered light is detected and by thereafter evaluating the scattered light signal measured as a function of time such that the precursor transformation from phase $AB_2$ to $A_{11}B_9$ is assigned to a point I which is characterized by a maximum signal, the surface chalcogenation of the developed layer is assigned to a point II which is characterized by a rapidly decaying signal intensity, with formation of the phase $ABC_2$ being initiated, (a) in case of a precursor layer without an excess of A, the complete formation of $ABC_2$, or (b) in case of a precursor layer with an excess of A, the entire phase separation of $ABC_2$ and the foreign phase $A_xC_y$ is assigned to a point III, and the transformation of a foreign phase $A_xC_y$ to a foreign phase AC is assigned to a point IV which is characterized by a rapidly decaying signal intensity.

In the context of the invention, the precursor materials used for A are the elements Cu or Ag, for B they are In or Ga or Al, and for C they are S or Se.

When measuring the difference signal formed by subtracting the amplitudes of two or more scattered light signals from the irradiation of the layer by coherent light of different wavelengths—as provided in accordance with one of the embodiments of the invention—the effect of the contamination of the optical paths of the scattered light is reduced. The method may then also be used in apparatus suffering from a relatively high degree of contamination.

The method in accordance with the invention is used for the production of polycrystalline Chalcogenide semiconductor layers by means of chalcogenation of metallic precursor layers. The production takes place in a lamp furnace or in a thermally heated furnace and may be accomplished within a very short time.

Whilst J. Vac. Sci. Technol. A 11 (4), July/August 1993, pp. 1792-1795 discloses a method of diffuse laser light scattering which is there utilized for defining the physical properties during the purification process of GaAs and the subsequent ZnSe/GaAs hetero epitaxy process, it does not disclose anything about phase transformations during the course of the optical signal, nor does it define the terminal point of the process, indicated by maximum values or rapidly decaying signal intensities.

During the described production process of the chalcogenide semiconductor layer structural and morphological modifications of the layer take place in a rapid chronological sequence. As a matter of surprise, characteristic points can be recognized in the recorded curve when the scattered light is measured in dependence of time during the chalcogenizing process. There definition or evaluation is useful in respect of the quality of the precursor layer (by its morphology) as well as of the process control (by the change of the layer morphology and the optical properties of the layer during its chalcogenation) and of the chronologically exact definition of the terminal point (on the basis of the precipitation of a foreign phase in the case of a precursor layer with an excess of A or on the basis of the termination of the complete chalcogenation in the case of a precursor layer without an excess of A).

Only knowledge of the connections between changes of the layer morphology and changes of the phases, phase precipitations during the chalcogenizing process and the course of the scattered light signal makes it possible selectively to influence the process.

DESCRIPTION OF THE SEVERAL DRAWINGS

Figure 2:
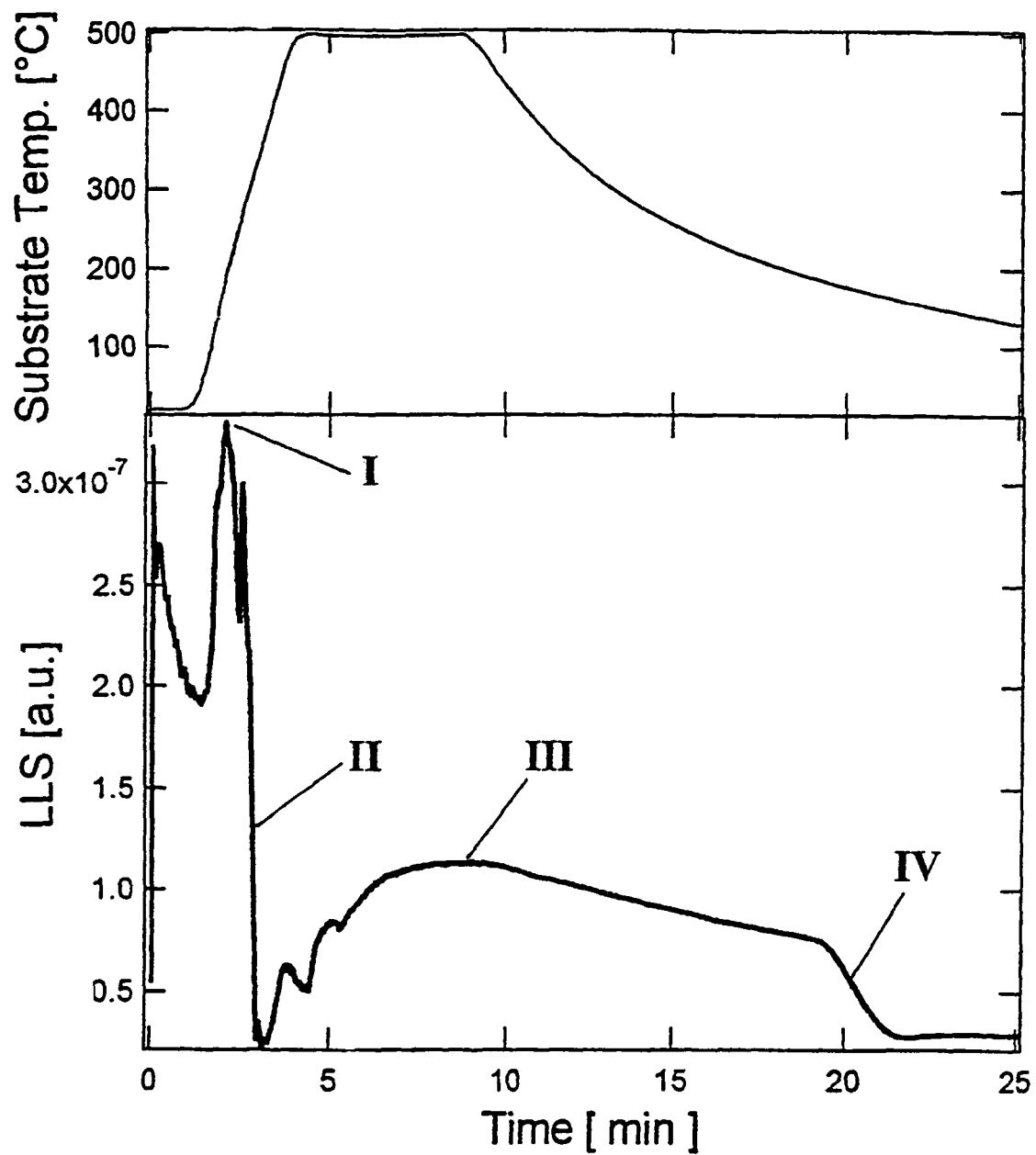

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read with reference to the appended drawings, in which:

FIG. 1 is a schematic presentation of the chalcogenation process including optical process control; and FIG. 2 depicts the measured curve of the scattered light signal as a function of time (lower curve) and the corresponding course of the substrate temperature (upper curve).

DETAILED DESCRIPTION OF THE PREFERRED EMBODIMENT

The schematic presentation of the chalcogenizing process of metallic precursor layers in FIG. 1 depicts a substrate S upon which the metallic precursor layers $L_A$ and $L_B$ have been deposited. Heating the substrate S by means of a heater H causes species of chalcogen, e.g. S or Se (as an element or in hydrogen compounds) to be conducted to the precursor layers $L_A$ and $L_B$ and bring about the chalcogenation. At the same time, light from a coherent light source K is directed onto the precursor layers $L_A$ and $L_B$ and is diffusely scattered at the surface. The diffuse scattered light is recorded by a detector D.

For comparison, FIG. 2 depicts the course of such a scattered light signal curve LLS (lower curve) as well as the curve of the substrate temperature (upper curve) as a function of time. Characteristic points, which can be used for process and quality control, are clearly discernible in the course of the scattered light transient LLS.

The significant points in FIG. 2 will be described with reference to the sulfurization of a CuIn precursor layer. The unexpectedly unambiguous association of the points could be unambiguously proved by simultaneously performed in situ X ray diffraction measurements.

Point I, characterized by a maximum signal intensity, is generated by a phase transformation $CuIn_2$ into $Cu_{11}B_9$. Its occurrence may be used for controlling the quality of the precursor. If a maximum does not occur, the precursor layer is either defective or it has been subjected to thermal processing. If, for instance, point I occurs at too high a temperature, it will indicate deviations from a nominal rate of heating. Accordingly, the detection of the point is equally useful for controlling the process.

Point II, characterized by a signal intensity which is rapidly decaying to low intensity values, is caused by the formation of surface $CuInS_2$. If point II occurs at too high a temperature, the precursor layer is either defective or the heating rate is too low. Hence, the detection of this point is useful for process control.

Point III, which is characterized by a second maximum signal intensity, is caused by (a) the termination of $CuInS_2$ in the case of precursor layers without excess Cu and (b) by termination of the phase separation of $CuInS_2$ and $Cu_xS_y$. Reaching point III may be used for controlling the process by terminating the process by lowering the heating power when point II has been reached.

Point IV, which is characterized by a signal intensity rapidly decaying to low intensity values, is caused by the transformation of phase $Cu_xS_y$ to CuS. The size of the signal difference before and after the rapid decay makes it possible to define the excess of Cu in the precursor layer. Detection of point IV is thus suitable for controlling the quality of the precursor layer.

What is claimed is:

1. A method of producing a chalcogenide semiconductor layer of the $ABC_2$ type, comprising the steps of:
    sequentially depositing two metallic precursor layers from elements A and B;
    chalcogenizing the deposited layers;
    simultaneously irradiating the layers with light from at least one source of coherent light;
    detecting measuring scattered light reflected from the layers;
    evaluating the measured scattered light as a function of time; and
    assigning precursor transformation of the compound $AB_2$ to $A_{11}B_9$ to a first point;
    assigning surface chalcogenation of the formed layer in which formation of the phase $ABC_2$ has been initiated to a second point;
    assigning the complete formation of $ABC_2$ in the case of a precursor layer without excess A or the complete phase separation of $ABC_2$ and the foreign phase $A_xC_y$ in the case of a precursor layer with excess A to a third point; and
    assigning the transformation of the foreign phase $A_xC_y$ to foreign phase A C to a fourth point.

2. The method of claim 1, wherein the element A is one of Cu and Ag, the element B is one of In, Ga and Al, and the element C is one of S and Se.

3. The method of claim 1, wherein the chalcogenizing surfaces is irradiated by light material of different wavelengths from different sources.

4. The method of claim 3, wherein the scattered light is measured in dependence of time as a difference signal formed by subtraction of the amplitude of the light from the different sources impinging upon the layer.

* * * * *